US 6,524,657 B2

(12) United States Patent
Leonte et al.

(10) Patent No.: US 6,524,657 B2
(45) Date of Patent: *Feb. 25, 2003

(54) SOLVENT SYSTEMS FOR POLYMERIC DIELECTRIC MATERIALS

(75) Inventors: Oana M. Leonte, Hayward, CA (US); Tadashi Nakano, San Jose, CA (US); Kelly M. Beres, Santa Clara, CA (US); Kreisler Lau, Sunnyvale, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/143,039

(22) Filed: May 7, 2002

(65) Prior Publication Data

US 2002/0183476 A1 Dec. 5, 2002

Related U.S. Application Data

(60) Division of application No. 09/340,976, filed on Jun. 28, 1999, now Pat. No. 6,413,202, which is a continuation-in-part of application No. 09/235,141, filed on Jan. 12, 1999, now Pat. No. 6,291,628.

(51) Int. Cl.[7] .............................. B05D 1/36; C08G 79/02
(52) U.S. Cl. .................................. 427/407.1; 428/411.1; 528/169; 528/125; 528/167; 528/403; 528/410; 528/422; 528/480; 528/494; 528/503
(58) Field of Search .................. 427/407.1; 428/411.1; 528/169, 125, 167, 483, 410, 422, 480, 494, 503

(56) References Cited

U.S. PATENT DOCUMENTS

| | | | |
|---|---|---|---|
| 4,732,785 A | 3/1988 | Brewer | 427/240 |
| 4,886,728 A | 12/1989 | Salamy et al. | 430/331 |
| 5,183,846 A | 2/1993 | Alba et al. | 524/865 |
| 5,362,608 A | 11/1994 | Flaim et al. | 430/327 |
| 5,436,083 A | 7/1995 | Haluska et al. | 428/688 |
| 5,814,433 A | 9/1998 | Nelson et al. | 430/326 |
| 6,413,202 B1 * | 7/2002 | Leonte et al. | 528/169 |

FOREIGN PATENT DOCUMENTS

| | | |
|---|---|---|
| EP | 0212334 | 3/1987 |
| EP | 0281825 | 9/1988 |
| EP | 0859022 | 8/1998 |

OTHER PUBLICATIONS

Purdy, et al., entitled "The dissolution of copper in common solvents used for low dielectric polymers", dated 1997, pp. 486–489.

* cited by examiner

Primary Examiner—Duc Truong
(74) Attorney, Agent, or Firm—Rutan & Tucker, LLP; Sandra P. Thompson; Robert D. Fish

(57) ABSTRACT

Aromatic aliphatic ether solvents, such as anisole, methylanisole, and phenetole, have been found useful in formulating coating solutions of polymeric dielectric materials and as a clean up solvent in the coating process. A process for forming a dielectric film on a substrate includes depositing a coating solution of a dielectric material in a formulation solvent onto a surface of the substrate and depositing an aromatic aliphatic ether solvent onto an edge portion of the surface of the substrate. The process is used to form films of dielectric materials including arylene ether dielectric polymers, hydridosiloxane resins, organohydridosiloxane resins, spin-on-glass materials, partially hydrolyzed and partially condensed alkoxysilane compositions which are cured to form a nanoporous dielectric silica material, and poly(perhydrido)silazanes.

30 Claims, 3 Drawing Sheets

# SOLVENT SYSTEMS FOR POLYMERIC DIELECTRIC MATERIALS

RELATED APPLICATIONS

This application is a divisional of allowed application Ser. No. 09/340,976, filed Jun. 28, 1999 now U.S. Pat. No. 6,413,202 which was a continuation-in-part of issued application Ser. No. 09/235,141 filed on Jan. 12, 1999 now U.S. Pat. No. 6,291,628.

FIELD OF THE INVENTION

This application relates generally to dielectric materials including low dielectric constant polymer materials and more particularly to solvent systems for use in formulation and clean up processing of such materials.

DESCRIPTION OF THE RELATED ART

As the dimension of the interconnect design rules for integrated circuits (IC) undergoes progressive shrinkage to sub-quarter micron metal spacing, the use of polymer dielectrics that minimize capacitance and reduce power consumption and cross talk, while increasing signal propagation speed becomes a necessity. The dielectric materials must possess dielectric constants no higher than 3.0 and should have dielectric constants as low as possible toward a theoretical limit of 1.0. The practical expectation for polymer dielectrics is in the range of 2.2 to 3.0. Both inorganic and organic polymer dielectrics are potentially useful. For organic dielectrics, the glass transition temperature is an important consideration. The organic dielectrics must have glass transition temperatures above 300° C. and as high as possible toward 450° C., a value determined by the thermal stability of organic polymers. The organic dielectrics should also be easily processed, preferably, by standard spin-bake-cure processing techniques. The organic dielectrics should also be free from moisture and out-gassing problems, in addition to having expected adhesive and gap-filling qualities, and dimensional stability towards thermal cycling, etching, and chemical mechanical polishing processes.

Arylene ether polymers have been identified as organic dielectric materials. Arylene ether polymers include poly (arylene ethers) (PAE) such as the FLARE™ material of AlliedSignal Inc. and the VELOX™ material of Schumacher. Other useful arylene ether polymers include poly (arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK), and poly(naphthylene ether) (PNE) comprising different polymer designs that include homopolymers, block or random copolymers, polymer blends, interpenetrating polymer networks (IPNs), and semi-interpenetrating polymer networks (SIPN)s. Additional examples of organic dielectric materials in current use include the polymeric material obtained from the phenylethynylated aromatic monomer provided by the Dow Chemical Company under the tradename SiLK™.

Organosilicon polymers have also been identified as low dielectric constant materials. In particular, siloxane based resins including hydridosiloxane resins, organohydridosiloxane resins, and spin-on-glass siloxanes and silsesquioxanes are used as dielectric layers. Other classes of organosilicon materials include poly(perhydrido)silazanes and nanoporous dielectric silica coatings formed from liquid alkoxysilane compositions.

Taking advantage of the low dielectric property of organic-containing polymeric materials requires the IC industry to continue to shift its processing paradigm. Processing approaches, such as the use of spin-coating, require selection of appropriate solvents for formulation of the coating solution, and for cleaning, edge-bead removal, and wafer backside rinsing. Desirable formulations will provide spin-coated polymer dielectric firms with excellent uniformity, a wide thickness range from hundreds of angstroms to hundreds of microns, very low out-gassing at high temperature, excellent gap-filling to 0.1 micron, excellent local, regional and global planarization, and ease of wafer edge bead removal and wafer backside rinsing. In addition, the dielectric polymer solution should be easily filtered to minimize its manufacturing cost.

While conventional alcoholic solvents, familiar to IC engineers, are obvious solvent candidates, they cannot necessarily be applied to organic materials. Ketonyl and other aprotic solvents have been used for photoresists and polymer dielectrics. In particular, cyclic ketonyl solvents are commonly used as solvents for arylene ether dielectrics. However, cyclic ketones normally are not as miscible with most arylene ether polymer dielectrics as would be desired and the spin-on solutions formulated from these solvents usually yield some extent of striation on the spin-coated film, especially for films with thicknesses greater than 1.5 micron. Serious striation could cause inadequate gap-filling, problems in adhesion of the dielectric film with a substrate and other problems. Additionally, cyclic ketonyl solvents have varying degrees of moisture, pH, and photosensitivities, often exacerbated by heat. For example, cyclopentanone is significantly more sensitive than first thought toward low pH, in addition to its well-known sensitivity toward light, moisture, and high pH. Cyclohexanone is more stable than cyclopentanone and has been a fair solvent for photoresists in the industry. However, cyclohexanone is still sensitive to light and non-neutral pH.

In addition, the solvents used must be environmentally acceptable. Cyclohexanone, discussed above, is considered to be barely tolerable by the industry due to its very low exposure limit. Given that 80% of all solvent used for spin-on processes, for example, is used at the clean up stage, including edge bead removal, wafer backside rinsing and spin-coater cup and nozzle rinsing, it is particularly important that the clean up solvent satisfy environmental considerations. It has also been recognized that solvents preferably should have sufficiently high flash points. For example, the inorganic spin-on polymer of poly(perhydrido)silazane is conventionally formulated in dibutyl ether, a solvent with a flash point of only 25 ° C. Increasingly stringent environmental requirements place new constraints on solvents used with all of the dielectric materials, organic, organosilicon, and inorganic polymers alike.

As knowledge in the application and processing of dielectric materials expands, shortcomings among the currently-used solvents are becoming more recognized. It would be desirable to provide process compatible and benign solvents for a wide range of dielectric polymer materials used in the semiconductor industry. In particular, it would be desirable to provide a family of extremely useful high-boiling point solvents for formulation of dielectric polymer solutions, edge bead removal of these dielectric films, and process equipment rinsing.

SUMMARY

In accordance with this invention, there is provided a new family of high boiling point, high flash point solvents, namely aromatic aliphatic ethers, which are utilized in the formation of dielectric polymer solutions and as a clean up solvent in the deposition of such materials. The chemical structures of this family of ethers is presented below. Several significant examples of this family are anisole ($C_6H_5OCH_3$, n=1, m=0) and phenetole ($C_6H_5OC_2H_5$, n=2, m=0) with a boiling point of 155 and 170° C., respectively, and 2-, 3-, or 4-methylanisole with a boiling point in the range of 170° C. to 175° C. The flash points of anisole and phenetole are 52° C. and 63° C., respectively.

| Solvent | R | $R_1$ to $R_5$ |
|---|---|---|
| ![structure] | $C_nH_{2n+1}$<br>n = 1 to 6 | $C_mH_{2m+1}$<br>m = 0 to 3 |

A process for forming a dielectric film on a substrate includes depositing a coating solution of a dielectric material in a formulation solvent onto a surface of the substrate and depositing an aromatic aliphatic ether solvent onto an edge portion of the surface of the substrate. Depositing the aromatic aliphatic ether solvent on the edge portion of the substrate surface provides edge bead removal. In the process of depositing these materials, the aromatic aliphatic ethers are also advantageously used for the clean up processes of wafer backside rinsing and equipment rinsing, such as spin-coater cup and nozzle rinsing.

The aromatic aliphatic ether solvent family is used as a clean up solvent in depositing a wide variety of dielectric materials. Mixtures of one or more of these solvents may be employed in this invention. The materials include organic polymers, particularly arylene ether dielectric polymers including poly(arylene ether) (PAE), poly(arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK) and their block or random copolymers and blends, including their blends with poly(carbosilanes). Organic dielectric materials also include porous poly (arylene ethers) and polymeric materials obtained from coating solutions of phenyl-ethynylated aromatic monomers.

The aromatic aliphatic ethers are also used as clean up solvents in the deposition of organosilicon dielectric materials. These materials include porous and non-porous films of hydridosiloxane resins, organohydridosiloxane resins, and spin-on-glass materials such as methylsiloxanes, methylsilsesquioxanes, phenylsiloxanes, and phenylsilsesquioxanes. They further include partially condensed alkoxysilane compositions which are cured to form a nanoporous dielectric silica material, and poly(perhydrido)silazanes.

According to another embodiment of the present invention, a process for producing low dielectric films on semiconductor substrates uses a coating solution of a dielectric material formulated in an aromatic aliphatic ether solvent. The process is used to apply dielectric materials including arylene ether dielectric polymers and polys. Films produced by this process advantageously have high thickness uniformity and do not exhibit striation.

DETAILED DESCRIPTION

Figure 1A:
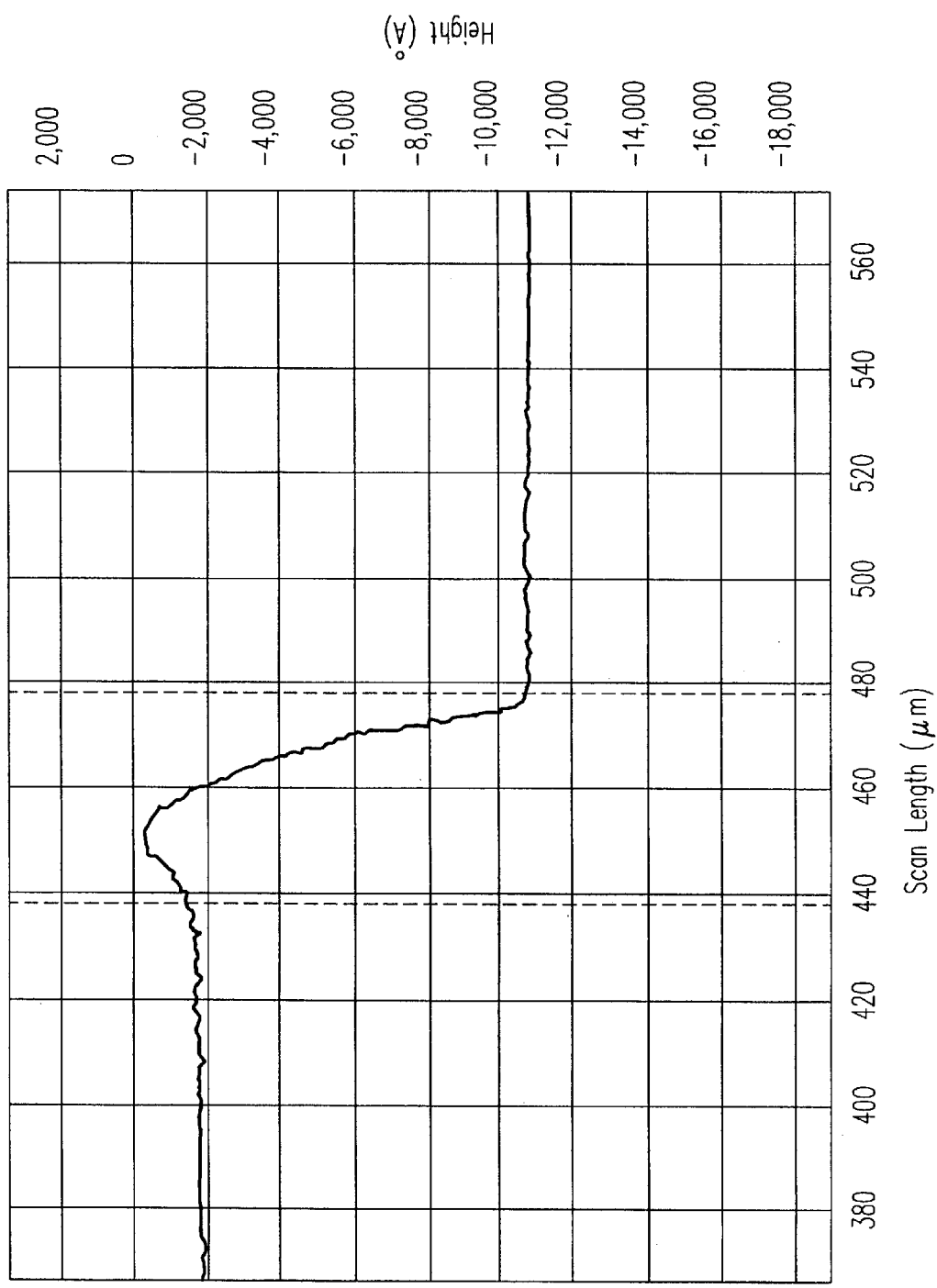
FIGS. 1a and 1b are measured edge profiles of a 1 μm thick layer of FLARE™ where edge bead removal was performed with anisole using a 5 second and 1 second dispense time, respectively, according to an aspect of the present invention.

Aromatic aliphatic ether solvents, such as anisole, methylanisole, and phenetole, have been found useful in formulating coating solutions of spin-on dielectric materials and as a clean up solvent for the processes of edge bead removal, wafer backside rinsing, and equipment rinsing.

The aromatic aliphatic ethers have the general formula

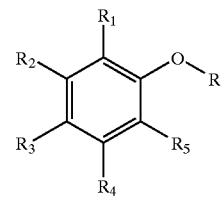

1 where R is $C_nH_{2n+1}$, n=1 to 6 and $R_1$ to $R_5$ is $C_mH_{2m+1}$, m=0 to 3. Advantageous examples of aromatic aliphatic ethers include anisole, $C_6H_5OCH_3$, where R=$CH_3$, corresponding to n=1 and $R_1$ to $R_5$=H, corresponding to m=0, and phenetole, $C_6H_5OC_2H_5$, where R=$C_2H_5$ (n=2) and $R_1$ to $R_5$=H (m=0). The boiling points of anisole and phenetole are 155° C. and 170° C., respectively. Other advantageous solvents include 2-, 3-, and 4-methylanisole with a boiling point in the range of 170° C. to 175° C.

In particular, the aromatic aliphatic ether solvents have been found useful for formulation and clean up of arylene ether polymers. An example of such a polymer is FLARE™ poly(arylene ether) of AlliedSignal Inc. These polymers have flexible structural moieties built into the uncured structures thereby maintaining the polymers' flexibility and low melt viscosity, which allows them to be formulated for spin-coating. After being spun onto the surface of a wafer, the polymers are thermally activated to undergo a cross-linking reaction and cured to give rise to a $T_g$ value above 250° C. and typically in the range of 300° C. to 450° C., without additional assistance from cross-linking additives.

The chemical structures shown below are two examples of poly(arylene ethers) which may be used as dielectric materials in the IC industry. The dielectric constant for arylene ether polymers typically falls between 2.5 to 3.0, which meets the requirement of next generation dielectrics for ultra large scale integration (ULSI).

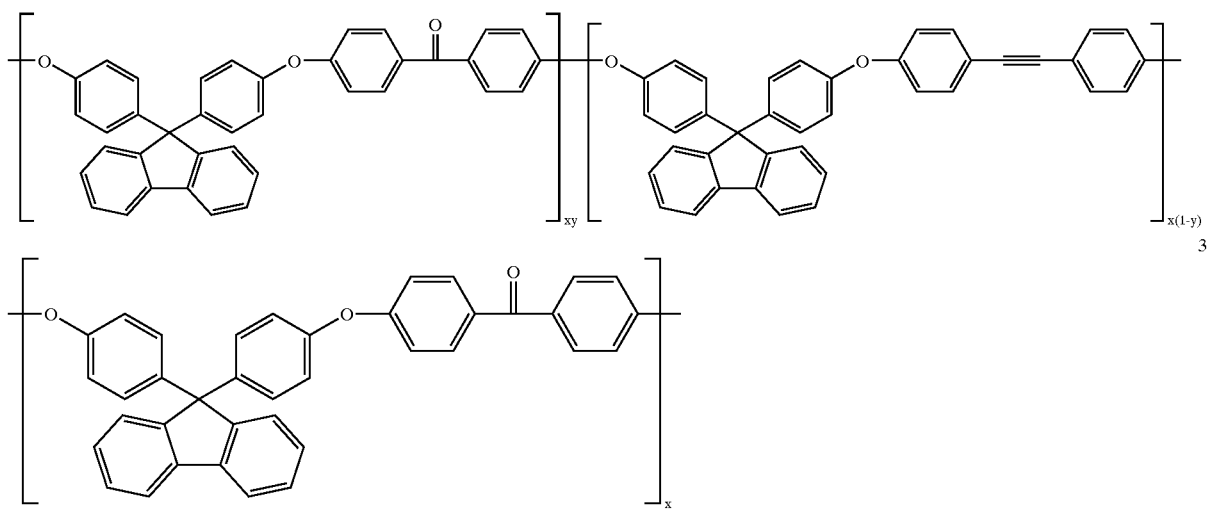

In formula 2 above, y is between 0 and 1. In both formulas 2 and 3, x is typically between about 2 and about 200. Preferably, x is between about 2 and about 100.

The polymer represented by formula 2 is disclosed, for example, in U.S. patent application Ser. No. 08/990,157 filed Dec. 12, 1997, to Lau et al. entitled "Poly(arylene ether) Compositions and Methods of Manufacture Thereof," which is commonly assigned with the present application and incorporated herein by reference.

Another example of a material useful in forming organic dielectric films is the end-capped poly(arylene ether) homopolymer of the general formula

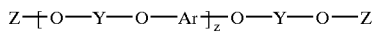

4 where z is between 1 and about 200, Y and Ar are each a divalent arylene radical and Z is a methyl group or a monovalent aryl radical. Polymers of formula 4 are disclosed in U.S. patent application Ser. No. 09/197,478 to Lau et al. entitled "Poly(arylene ether) Homopolymer Compositions and Methods of Manufacture Thereof," which is commonly assigned with the present application and incorporated herein by reference.

In addition to finding application with the poly(arylene ether) polymers of formulas 2 to 4 above, the aromatic aliphatic ethers are appropriately used as solvents with organic dielectric polymers including poly(arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK) and their block or random copolymers and blends. Mixtures of one or more of these solvents may be employed in this invention. Alternatively, a solvent mixture including one or more aromatic aliphatic ether solvents and cyclohexanone may be used.

Polymer solutions, in accordance with embodiments of the present invention, are formed by combining aromatic aliphatic ethers and low dielectric constant polymers, such as arylene ether polymers, under ambient conditions in any conventional apparatus having a non-metallic lining. Preferably, a glass-lined apparatus is employed. The resulting solution is comprised of, based upon the total weight of the solution, from about 1 to about 50%, and preferably from about 5% to about 30% of the polymer dielectric and from about 50% to about 99%, and preferably from about 70% to about 95% of solvent.

The resulting solution is then filtered under ambient conditions via any of the filtration devices well known in the art including, but not limited to commercially available filtration cartridges having the desired porosity. It is generally preferable to use a filtration device having a pore size less than about 1.0 μm. A typical filtration uses a pore size of about 0.1 μm. Alternatively, the solution is filtered sequentially through about 4 filtration means of decreasing pore size, the final pore size being approximately 0.1 μm or less.

Typically, the solutions are applied to semiconductor wafers using a spin-coating process. However, dip-coating, spray-coating, or other coating methods known in the art, can also be employed. The following description of a spin-coating process is generally applicable to the wide range of polymeric. dielectric materials used in the semiconductor industry. In the spin-coating process, the polymer solution is dispensed onto a silicon wafer substrate at or near its center. In some embodiments, the wafer will remain stationary during the dispense cycle, while in some embodiments, the wafer will turn or spin at a relatively low speed, typically less than about 1000 revolutions per minute (rpm). The dispense cycle is optionally followed by a short rest period and then additional spins, hereinafter referred to as thickness spins, generally between approximately 2000 and 5000 rpm, although other spin speeds may be used, as appropriate. In one typical process, the dispense step includes a 5 second spin at 1000 rpm while the solution is dispensed and a subsequent 1 second spreading spin at 1000 rpm. The dispense step is followed by a 30 second thickness spin at 2000 rpm. The coating process additionally includes cleaning steps discussed in more detail below Once the coating process is completed, the coated substrate, that is the substrate coated with the polymer solution, is heated to effect a bake process and a subsequent cure process. Any conventional apparatus known in the art can be employed for these processes. Preferably, the apparatus for the bake process is an integral part of a spin-coating apparatus used for coating the substrate or wafer, although a separate apparatus for curing coatings is also suitable. The bake process can be carried out in an inert atmosphere such as an atmosphere of an inert gas or nitrogen. One commonly employed heating apparatus employs one or more "hot plates" to heat the coated wafer from below. The coated wafer is typically heated for up to about 120 sec at each of several hot plates at successively higher temperatures. Typically, the hot plates are at temperatures between about 70° C. and 350° C. One typical process employs a heating apparatus having three hot plates. First, the wafer is baked for about 60 sec at 150° C. Then the wafer is transferred to a second hot plate for an approximately 60 sec bake period at 200° C. Finally, the wafer is transferred to a third hot plate for a third bake period of approximately 60 sec at 250° C.

A final cure process is often employed to complete the curing of the film. The cure is preferably performed in an inert atmosphere, as described above for the bake. This final cure process can employ a conventional thermal curing apparatus, for example a horizontal furnace with a temperature range of about 300° C. to about 450° C. and preferably from about 375° C. to about 425° C. In one typical furnace cure process, the baked wafer is cured for 30 minutes to one hour at 400° C. at a nitrogen flow rate of 4 liters/min to 20 liters/min.

It will be understood that the above bake and cure processes were described for illustrative purposes only and that other temperatures, durations, and number of bake cycles can be employed, where appropriate.

It has been found that solutions of arylene ether polymers such as those of formulas 2 and 3, formulated in anisole, methylanisole, and phenetole yield totally striation-free films. In contrast, as demonstrated in Example 3 below, films produced from solutions in conventional solvents exhibit striation. Owing to the better polymer solubility, the workable spin speed range in the spinning step is wider than the corresponding cyclohexanone solutions. The standard deviation of uniformity of film spin-coated from anisole, methylanisole, or plienetole solutions over the silicon wafers is found to be lower than that of films spin-coated from the corresponding cyclohexanone solution. For example, the standard deviation of a film formed from an 18 weight % solution of a polymer of formula 2 in phenetole was less than 0.3%. Additionally, the lower viscosity of the anisole, methylanisole, and phenetole solutions permit the polymer dielectric solution to be still effective at filling narrow (<0.15 μm), high aspect ratio gaps at high spin speed, such as in the 4000 to 5000 rpm range. The wider window of these solutions yields a wider thickness range for each version of spin-on polymer solution than the corresponding cyclohexanone solution.

In the coating process described above, the coating solution is typically dispensed on a spinning wafer substrate. The force exerted on the spinning coating solution may cause an amount of the solution to build up on the edge portion of the substrate forming an edge bead. Typically the edge bead is displaced about 3 mm from the edge of the wafer. The coating process additionally includes the process of edge bead removal which is performed after dispensing the coating solution and before the coated substrate is baked and cured. The edge bead removal process includes dispensing a solvent from a nozzle positioned near the edge of the wafer such that the solvent is deposited on an edge portion of the surface of the substrate including the edge bead. A typical process includes a from 1 to 5 second dispense spin at 1500 rpm and a spin dry step consisting of a 2 to 6 second spin at from 1500 to 3000 rpm.

Following the coating solution deposition and proceeding the edge bead removal, additional cleaning steps are typically carried out. These cleaning steps, for which some typical parameters are provided, include a wafer backside rinse (5 second spin at 800 rpm), and a nozzle rinse (1 second spin at 3000 rpm). The aromatic aliphatic ethers are advantageously used as solvents for the wafer backside rinsing, edge bead removal, and general equipment clean up because of the higher miscibility of poly(arylene ether) polymers in aromatic aliphatic ethers than in conventional solvents. In particular, as shown in Example 5 below, when anisole is used for edge bead removal of a solution of polymer 2, considerably less solvent is needed than when cyclohexanone is used. For a 200 mm wafer, a 1 sec dispense time which uses only 1 ml of anisole is sufficient while for cyclohexanone a 5 sec dispense time which requires five times as much solvent is typically used. Thus, anisole has been demonstrated to be effective for both formulation and clean up of poly(arylene ether) films, where clean up, as used here, includes edge bead removal, wafer backside rinsing, and coater equipment rinsing. Use of the same solvent used throughout the spin coating provides an additional environmental advantages due to the ease of recyling.

As discussed above, the aromatic aliphatic ether solvents presented here are useful as clean up solvents for use with a variety of organic polymer dielectric materials. These include not only the arylene ether polymers listed above and porous films of arylene ether polymers, but also organic dielectrics such as the polymeric material obtained from the phenyl-ethynylated aromatic monomers and oligomers provided by the Dow Chemical Company under the tradename SiLK™ and poly(arylene ether) provided by Schumacher under the tradename VELOX™. Additionally, the aromatic aliphatic ether solvents are used as clean up solvents for poly(arylene ethers) blended with poly(carbosilanes). Furthermore, although the spin-coating technique has been presented in detail, the solvents according to the present invention, can be used as clean up solvents for edge bead removal and equipment rinsing for other coating techniques, such as those that do not involve a spin step.

A second class of dielectric materials with which aromatic aliphatic ether solvents are used is materials containing siloxane resins. Examples of such resins are the organohydridosiloxane resins having one of the four general formulas:

| | |
|---|---|
| $(HSiO_{1.5})_n(RSiO_{1.5})_m$; | 5 |
| $(H_{0.4-1.0}SiO_{1.5-1.8})_n(R_{0.4-1.0}SiO_{1.5-1.8})_m$; | 6 |
| $(H_{0-1.0}SiO_{1.5-2.0})_n(RSiO_{1.5})_m$; or | 7 |
| $(HSiO_{1.5})_x(RSiO_{1.5})_y(SiO_2)_z$ | 8 | where the sum of n and m is from about 8 to about 5000 and m is selected such that the organic substituent is present in an amount from about 1 mole percent (Mol %) to about 99 Mol %; the sum of x, y, and z is from about 8 to about 5000 and y is selected such that the organic substituent is present in an amount from about 1 Mol % to about 99 Mol % and R is selected from substituted and unsubstituted straight chain and branched alkyl groups, cycloalkyl groups, substituted and unsubstituted aryl groups, and mixtures, thereof. The specific mole percent of carbon containing substituents is a function of the amounts of starting materials. Polymers of formula 5–8 are further described in U.S. patent application Ser. Nos. 09/044,798 and 09/044,831, which are commonly assigned with the present application and incorporated herein by reference.

Dielectric films from organohydridosiloxane resins are typically formed by a spin-coating process that is substantially similar to the process described above in connection with poly(arylene ether) films. The deposition for such resins is further described in U.S. patent application Ser. Nos. 09/227,035 and 09/227,498, which are commonly assigned with the present application and incorporated herein by reference.

The coating process for organohydridosiloxane resin solutions typically also includes an edge bead removal step after the spin deposition step. The aromatic aliphatic ethers are particularly effective at edge bead removal of films of organohydridosiloxane resins. For example, using anisole for edge bead removal of a methylhydridosiloxane resin with 80% methyl content produces a very good edge profile. As described in Example 6 below, for these materials, the process of edge bead removal typically uses two dispense steps, each about a 3 second spin at about 1000 rpm. The aromatic aliphatic ethers are similarly effective for the remainder of the clean up processes in preparing films of organohydridosiloxane resins including wafer backside rinsing, and coater equipment cleaning, such as spin-coater cup and nozzle rinsing and line flushing.

Another low dielectric constant organosilicon material is the nanoporous silica dielectric coating formed from an alkoxysilane composition containing an alkoxymonomer of the formula:

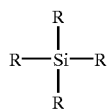

9 where at least 2 of the R groups are independently $C_1$ to $C_4$ alkoxy groups and the balance, if any, are independently selected from the group consisting of hydrogen, alkyl, phenyl, halogen and substituted phenyl. Preferably, each R is methoxy, ethoxy, or propoxy. Such polymers are commercially available from AlliedSignal as Nanoglass™. The most preferred alkoxysilane monomer is tetraethoxysilane (TEOS).

The aromatic aliphatic ethers are also advantageously used in the clean up phase of depositing the alkoxysilane materials. To form a nanoporous silica coating, a partially hydrolyzed and partially condensed alkoxysilane composition including an alkoxysilane monomer of formula 9 in a suitable solvent is spin deposited on a wafer substrate. The coated substrate is subsequently cured, in a final step, to form a nanoporous silica coating. Following deposition, edge bead removal of the alkoxysilane material is typically performed using the solvent propyleneglycol methylether acetate (PGMEA) according to a protocol which includes two dispense spins and two drying spins. During the first dispense spin, a nozzle is positioned a first distance from the edge of the wafer, for example, between about 3 mm and 8 mm from the edge for a 200 mm wafer, to partially remove the edge bead. During the second dispense spin, the nozzle is positioned slightly further from the edge, to substantially remove the edge bead. The alkoxysilane composition deposition and edge bead removal process is detailed in U.S. patent application Ser. No. 09/156,220 entitled "Edge Bead Removal for Nanoporous Dielectric Silica Coatings," which is commonly assigned with the present application and incorporated herein by reference.

As described in Example 7, for the alkoxysilane material prepared from the TEOS monomer using PGMEA as the solvent, two dispense spins, the second of which is 5 seconds in length are used. For anisole as the edge bead removal solvent a single dispense spin of 0.5 seconds is sufficient for good edge profiles. Thus use of anisole accomplishes edge bead removal with only a tenth the volume of solvent. The aromatic aliphatic ethers are similarly effective for other clean up processes in preparing porous films from alkoxysilane monomers including wafer backside rinsing, spin-coater cup and nozzle rinsing and line flushing.

In addition, the solvents are used for clean up processes in preparing other porous films, in particular porous films of the organohydridosiloxane resins of formulas 5–8. They are also used for clean up with coating solutions of spin-on-glass materials such as methylsiloxanes, methylsilsesquioxanes, phenylsiloxanes and phenylsilsesquioxanes, including clean up for processes for porous spin-on-glass materials. With respect to deposition of these and all of the dielectric materials enumerated, the solvents according to the present invention, can be used as clean up solvents for edge bead removal and equipment rinsing for coating techniques that do not involve a spin step.

In yet another application, the aromatic aliphatic ethers presented here provide advantageous solvent media for both formulation and clean up of inorganic spin-on polymers, particularly the polymer of poly(perhydrido)silazane. The poly(perhydrido)silazane is typically formulated in dibutyl ether (DBE), a solvent with a flash point of only 25° C. Poly(perhydrido)silazane is provided under the name ASP™ by the Tonen Corporation. Because of the low flash point and for other environmental reasons, DBE is not an industrially preferred solvent. In contrast, anisole has a flash point of 52° C. and phenetole has a flash point of 63° C. Anisole is advantageously used as a formulation solvent for poly(perhydrido)silazane in place of DBE. A coating solution of poly(perhydrido)silazane in anisole is spin deposited according to the process described above for deposition of poly(arylene ether) films. Films produced from poly(perhydrido)silazane formulated in anisole have an excellent film appearance. A 20% by weight resin solution of poly(perhydrido)silazane in anisole gave a film thickness of 4300 Å under the same conditions where a 20% resin solution in DBE provided a film thickness of 3800 Å. A further comparison of solvent properties and film results is provided below in Example 8. Anisole has further been demonstrated to be an effective solvent for edge bead removal of poly(perhydrido)silazane films. A single dispense spin of 4.5 seconds was sufficient for good quality edge profiles.

The aromatic aliphatic ethers used in this invention, such as anisole, methylanisole and phenetole, are very stable organic solvents upon exposure to air, strong acid, and base even at elevated temperatures. Unlike, for example, cyclic ketonyl solvents, no derivatives of anisole, methylanisole, and phenetole are detected by gas chromatography (GC) when they are kept in contact with an acidic medium, for example, a sulfonic acid type resin, in air for days. This greatly minimizes the out-gassing of polymer dielectric films at temperature of about 400° C. and above. Isothermal thermogravimetric analysis (ITGA) at 425 and 450° C. demonstrates significantly less weight loss for the film spin-coated from anisole or methylanisole or phenetole solutions compared with that of films spin-coated from cyclohexanone solution.

Anisole, methylanisole, phenetole, and the other aromatic aliphatic solvents are very benign solvents to the environment and the workplace. Anisole has long been used in the perfume industry and no significant hazardous concerns have ever been raised. High purity anisole, methylanisole, and phenetole with less than 50 ppb for all metals are widely commercially available at competitive prices. Together with all the property improvement on the dielectric film of arylene ether polymers, anisole, methylanisole, phenetole and other aromatic aliphatic ether solvents provide more robust polymer dielectric films for the semiconductor and microelectronic industries.

As a result, polymer dielectric solutions based on aromatic aliphatic ether solvents, such as anisole, methylanisole and phenetole are benign, provide decreased manufacturing cost for the spin-on dielectric polymer, provide the polymer solutions with the capability to achieve high thickness, wider windows and a wider thickness range, and provide striation-free polymer dielectric films with improved gap-filling capability, low out-gassing and high glass transition temperatures. Furthermore, aromatic aliphatic ether solvents provide clean up solvents that are effective, environmentally friendly., and that can dramatically reduce the total volume of solvent needed.

The methods of using aromatic aliphatic ether solvents for formulation of polymer dielectric materials and clean up processing are further illustrated in the following examples.

EXAMPLE 1

An 18 weight % solution of the poly(arylene ether) of formula 2 with y=0.5 the FLARE™ material of AlliedSignal, was prepared by dissolving an appropriate weight of the solid polymer in phenetole under ambient conditions in a glass lined reactor. The solution was filtered through a series of four Teflon® filtration cartridges. The filtration cartridges have decreasing nominal pore sizes of 1.0, 0.5, 0.2, and 0.1 μm, respectively.

EXAMPLE 2

Approximately 3 ml of the filtered solution of Example 1 was processed onto the surface of a four inch silicon wafer using a spin coater and hot plate oven track, for example a Silicon Valley Group, Inc. (SVG) Model No. 8828 coater and SVG model No. 8840 oven track. After the solution was dispensed, the wafer was spun at 500 rpm for 5 seconds, followed by a 5 second rest and a 60 second spin at various speeds between 1000 and 5000 rpm, as reported below. The coated wafer was baked at 180° C. for one minute. The baked wafer was then cured in a nitrogen atmosphere in a furnace set initially at 200° C. followed by a ramp to 400° C. at 5° C./minute and a ramp to 425° C. at 1.5° C./minute, held at 425° C. for one hour, followed by a cool down to 100° C. Properties of the resulting films are given below in Table 1.

TABLE 1

Properties of Films from 18 wt % Solution in Phenetole as a Function of Spin Speed

| Property | 1000 rpm | 1500 rpm | 2000 rpm | 3000 rpm | 4000 rpm | 5000 rpm |
|---|---|---|---|---|---|---|
| Gap fill | <0.15 μm | <0.15 μm | <0.15 μm | <0.15 μm | <0.15 μm | <0.15 μm |
| Planarization | 75% | 80% | 75% | 70% | 68% | 65% |
| Thickness* | 1,801 Å | 1,449 Å | 1,260 Å | 1,033 Å | — | — |
| Uniformity** | 0.44% | 0.18% | 0.23% | 0.27% | — | — |
| Striation*** | None | None | None | None | — | — |

*Thickness after cure
**Standard deviation of five measurements
***Determined by examination under optical microscope

EXAMPLE 3

13 wt % solutions of FLARE™ in the various conventional solvents were prepared and processed into films as described in Examples 1 and 2 above for comparison with a polymer solution in phenetole. Films were graded on thickness uniformity, defined as standard deviation <0.3% and optical quality, defined as absence of striation on examination under an optical microscope.

TABLE 2

Film Quality as Function of Solvent

| Solvent | Uniformity | Optical Quality |
|---|---|---|
| Phenetole | Pass | Pass |
| 1:1 cyclohexanone/γ-butyrolactone | Fail | Fail |
| 1:1 cyclohexanone/N-methylpyrrolidinone | Fail | Fail |
| 1:1 N-methylpyrrolidinone/γ-butyrolactone | Fail | Fail |
| 4:1 cyclohexanone/diphenyl ether | Pass | Fail |
| Diglyme | Fail | Fail |
| N,N-dimethylacetamide | Fail | Fail |

EXAMPLE 4

A poly(arylene ether) homopolymer of formula 4 in which Y, Ar, and Z are:

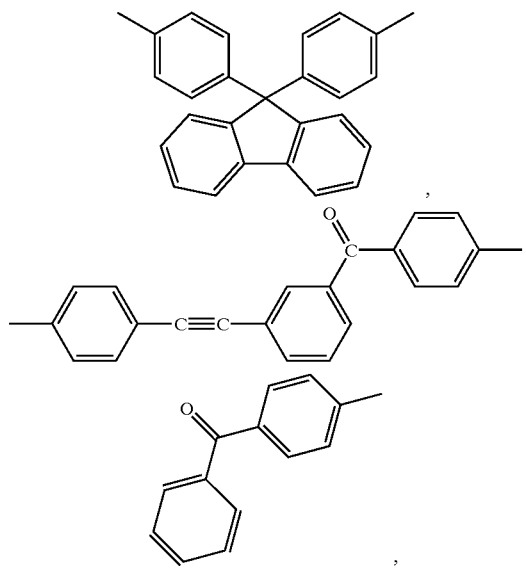

respectively was prepared and combined with anisole to form an 18 wt % solution. After 3 ml of the solution was dispensed, the wafer was spun at 500 rpm for 5 seconds, followed by a 5 second rest and a 60 second spin at 2000 rpm. The wafer was cured at 425 ° C. for one hour. Film thickness was 1.06 μm after curing.

EXAMPLE 5

A 1 μm thick film of FLARE™ material was deposited on a silicon nitride coated wafer substrate using a SEMIX TR 8132-C spin coater using the process recipe described in Example 2. After deposition and before the bake and cure steps, edge bead removal (EBR) was performed with anisole and with the comparative solvent cyclohexanone according to the recipe given-below in Table 3.

TABLE 3

Parameters for EBR of FLARE ™ Films

| Step | Anisole | Cyclohexanone |
|---|---|---|
| Dispense | 1 sec or 5 sec | 5 sec |
|  | 1500 rpm | 1500 rpm |
| Spin dry | 3 sec | 3 sec |
|  | 1500 rpm | 1500 rpm |

Figure 1B:
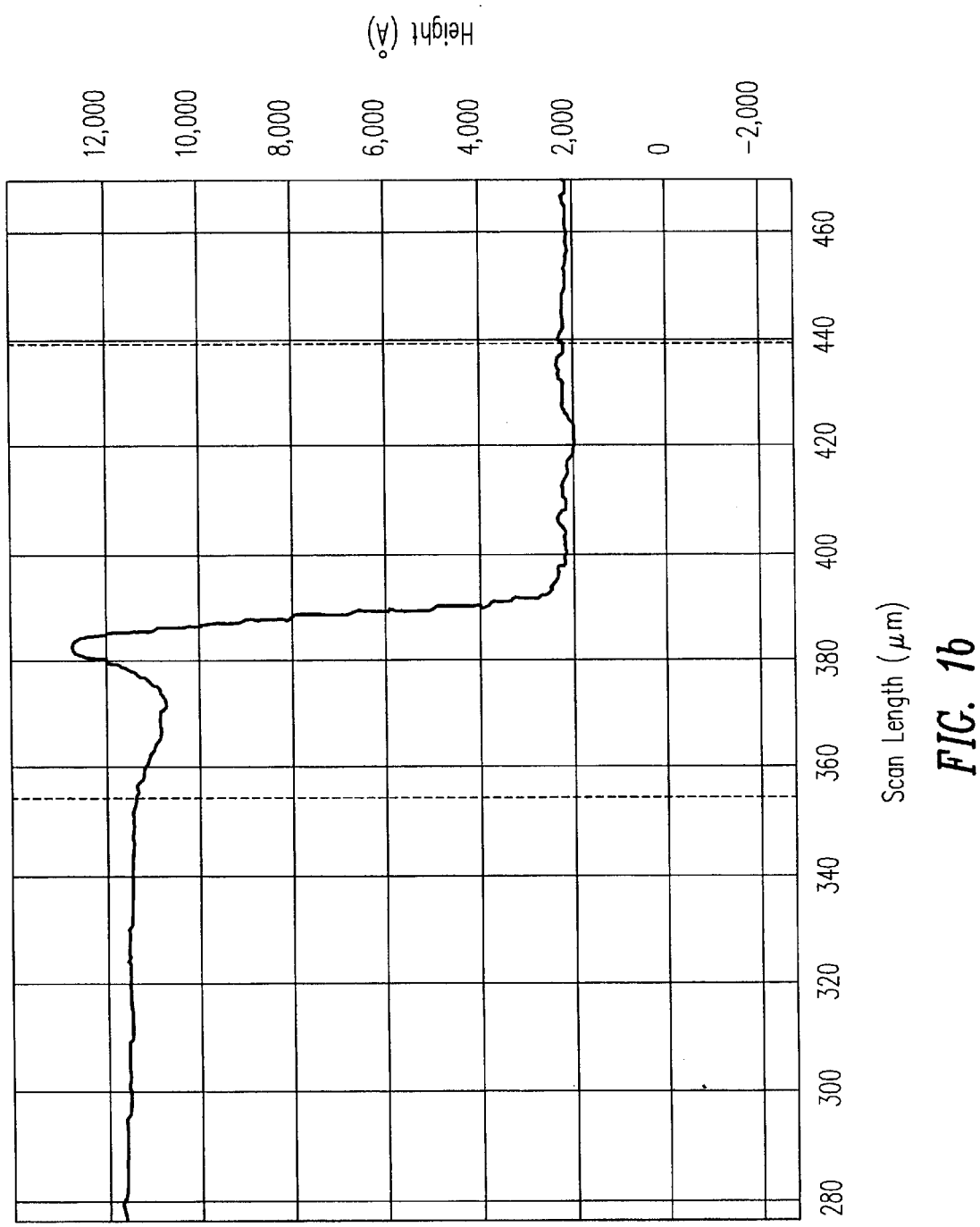
Figure 1C:
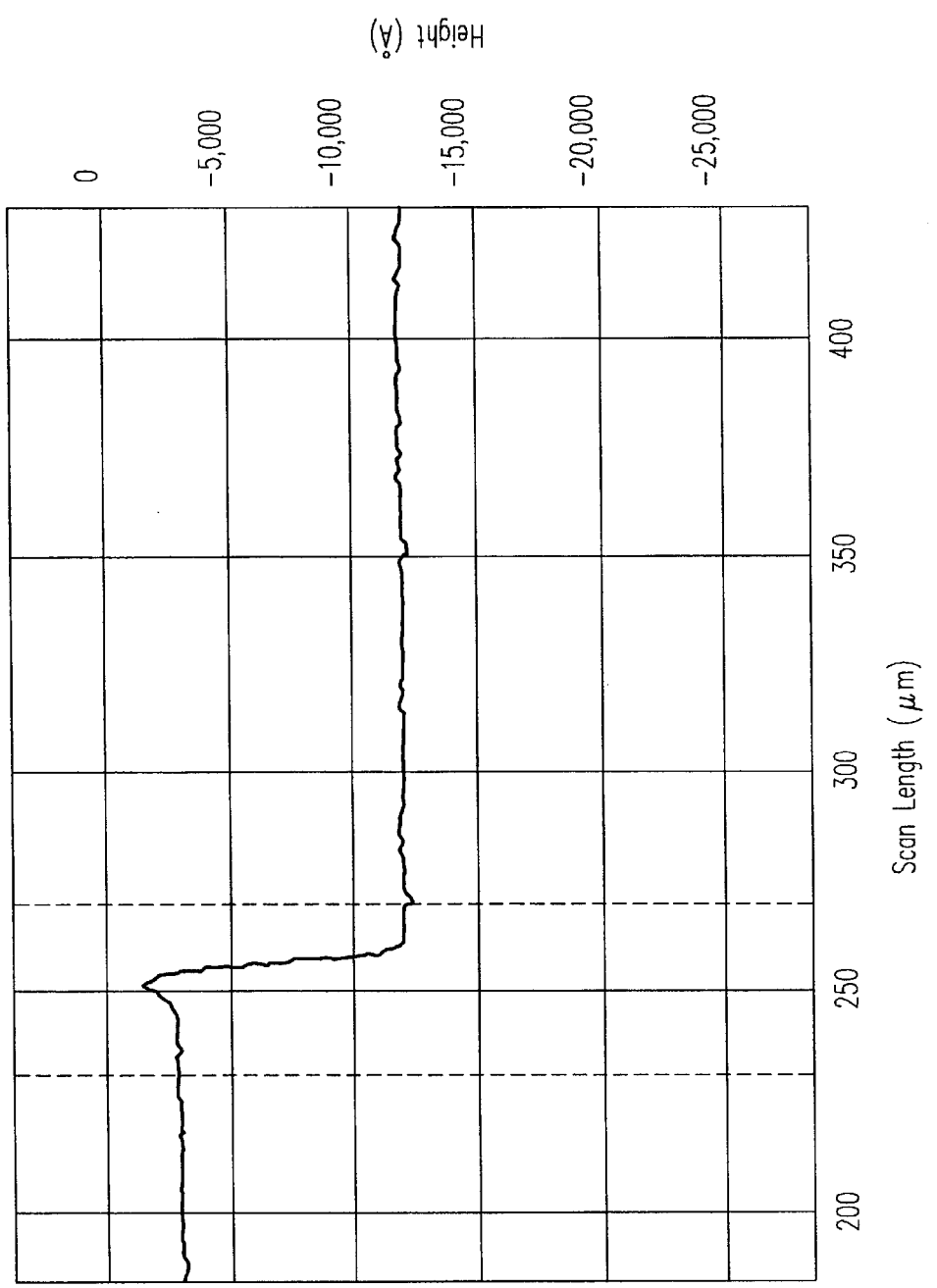
FIG. 1c is the measured edge profile of the same material where edge bead removal was performed with cyclohexanone using a 5 second dispense time, according to the prior art.

Edge bead profiles measured after the bake and cure with a Sloan Dektak II profilometer are compared in FIGS. 1a–1c, which show profiles for a 5 second and 1 second dispense with anisole as the edge bead removal solvent and for a 5 second dispense with cyclohexanone as the solvent, respectively. Good profiles were obtained in all cases, in particular with a 1 second anisole dispense time, which amounts to 1 ml of anisole, a factor of five smaller volume than used with cyclohexanone as the solvent.

EXAMPLE 6

A polymer solutions of an 80% methyl organohydridosiloxane resin was coated on a substrate using a conventional spin coater. Edge bead removal was performed with anisole and with the comparative aliphatic hydrocarbon solvent NRD provided by Ashland Chemical Co. (CAS registry 8052-41-3) according to the following parameters. Bake and cure steps as described in U.S. application Ser. No. 09/227, 498 were performed.

TABLE 4

EBR of 80% Methyl Organohydridosiloxane Films

| Step | Anisole | NRD |
|---|---|---|
| Dispense 1 | 3 sec | 3 sec or 5 sec |
|  | 1000 rpm | 1000 rpm |
| Dispense 2 | 3 sec | 3 sec |
|  | 1000 rpm | 1000 rpm |

The EBR dispense nozzle was moved closer to the edge between the first dispense step and the second dispense step. A good edge profile was observed with anisole as the EBR solvent, equivalent to the results with the comparative solvent NRD.

EXAMPLE 7

Deposition of a partially hydrolyzed and partially condensed alkoxysilane composition for forming nanoporous dielectric coatings containing TEOS, triethyleneglycol monomethylether, water and nitric acid was performed on a commercial spin coater (Dai Nippon Screen D-Spin 80 Å). After deposition, edge bead removal was performed with anisole and with the comparative solvent propyleneglycol methylether acetate (PGMEA) according to the following parameters.

TABLE 5

Parameters for EBR of TEOS composition

| Step | Anisole | PGMEA |
|---|---|---|
| Dispense 1 | 0.5 sec | 1 sec |
|  | 1500 rpm | 500 rpm |
| Dispense 2 | none | 4 sec |
|  |  | 1500 rpm |
| Spin dry | 1 sec | 1 sec |
|  | 2000 rpm | 2000 rpm |
| Spin dry 2 | 10 sec | 10 sec |
|  | 500 rpm | 500 rpm |

The coated substrate was aged and cured. A good edge profile was observed using a single 0.5 sec dispense time with, requiring a factor of 10 smaller volume of solvent than using the comparative solvent PGMEA.

EXAMPLE 8

A solution of poly(perhydrido)silazane in pyridine, ASP™ 2.0 (Tonen Corporation) was solvent exchanged with anisole and with the comparative solvent dibutyl ether (DBE) to prepare 20 wt % resin coating solutions. 3 ml of the solutions were spin coated onto 6 inch silicon wafer substrates. The wafer were spun at 2000 rpm for 60 seconds. Edge bead removal was performed with anisole and DBE. A single dispense spin of 4.5 seconds at 2000 rpm was used. Excellent edge profiles were obtained with anisole and DBE. The coated substrates were baked for 3 minutes each on hot plates at 150° C., 200° C., and 300° C. and cured at 400° C. for 60 minutes under an oxygen flow of 5 liters/min. As shown in the following table, excellent film appearance was obtained with anisole as a formulation solvent.

TABLE 5

Formulation solvents and films for poly(perhydrido)silazane

|  | Anisole (20 wt % resin) | DBE (20 wt % resin) |
|---|---|---|
| Boiling Point | 154° C. | 151° C. |
| Density | 0.88 g/cm$^3$ | 0.75 g/cm$^3$ |
| Viscosity | 1.2 cP | 0.8 cP |
| Solubility | OK | OK |
| Film Thickness | 4300 Å | 3800 Å |
| Film Appearance | Excellent | Excellent |

Although the invention has been described with reference to particular examples, the description is only an example of the invention's application and should not be taken as a limitation. Various adaptations and combinations of features of the examples disclosed are within the scope of the invention as defined by the following claims.

We claim:

1. A process for forming a dielectric film on a surface, comprising:

depositing a coating solution on the surface; and depositing at least one aromatic aliphatic ether solvent on to the edge portion of the surface.

2. The process of claim 1, wherein the surface comprises a substrate.

3. The process of claim 1, wherein depositing a coating solution comprising spinning on the coating solution.

4. The process of claim 1, wherein depositing at least one aromatic aliphatic ether, solvent comprises depositing two or more aromatic aliphatic ether solvents.

5. The process of claim 1, wherein depositing at least one aromatic aliphatic ether solvent further comprises depositing at least one other solvent.

6. The process of claim 4, wherein depositing two or more aliphatic ether solvents further comprises depositing at least one other solvent.

7. The process of claim 5, wherein the at least one other solvent comprises cyclohexanone.

8. The process of claim 6, wherein the at least one other solvent comprises cyclohexanone.

9. The process of claim 1, wherein the coating solution comprises a dielectric material and a formulation solvent.

10. The process of claim 9, wherein the dielectric material comprises a monomer having the formula:

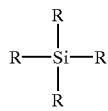

where at least 2 of the R groups are independently $C_1$ to $C_4$ alkoxy groups.

11. The process of claim 10, wherein the R groups may further comprise hydrogen, alkyl, phenyl, halogen or substituted phenyl.

12. The process of claim 10, wherein the R groups comprise methoxy, ethoxy or propoxy.

13. The process of claim 9, wherein the formulation solvent comprises at least one aromatic aliphatic ether solvent.

14. The process of claim 1, wherein the surface comprises at least one gap that measures less than about 0.15 micrometers.

15. The process of claim 1, wherein the dielectric film comprises a plurality of pores.

16. A microelectronic device comprising a dielectric film formed on a surface by the process comprising:
depositing a coating solution on the surface; and
depositing at least one aromatic aliphatic ether solvent on to the edge portion of the surface.

17. The microelectronic device of claim 16, wherein the surface comprises a substrate.

18. The microelectronic device of claim 16, wherein depositing a coating solution comprising spinning on the coating solution.

19. The microelectronic device of claim 16, wherein depositing at least one aromatic aliphatic ether solvent comprises depositing two or more aromatic aliphatic ether solvents.

20. The microelectronic device of claim 16, wherein depositing at least one aromatic aliphatic ether solvent further comprises depositing at least one other solvent.

21. The microelectronic device of claim 19, wherein depositing two or more aliphatic ether solvents further comprises depositing at least one other solvent.

22. The microelectronic device of claim 20, wherein the at least one other solvent comprises cyclohexanone.

23. The microelectronic device of claim 21, wherein the at least one other solvent comprises cyclohexanone.

24. The microelectronic device of claim 16, wherein the coating solution comprises a dielectric material and a formulation solvent.

25. The microelectronic device of claim 24, wherein the dielectric material comprises a monomer having the formula:

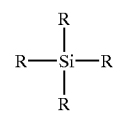

where at least two of the R groups are independently $C_1$ to $C_4$ alkoxy groups.

26. The microelectronic device of claim 25, wherein the R groups may further comprise hydrogen, alkyl, phenyl, halogen or substituted phenyl.

27. The microelectronic device of claim 25, wherein the R groups comprise methoxy, ethoxy or propoxy.

28. The microelectronic device of claim 24, wherein the formulation solvent comprises at least one aromatic aliphatic ether solvent.

29. The microelectronic device of claim 16, wherein the surface comprises at least one gap that measures less than about 0.15 micrometers.

30. The microelectronic device of claim 16, wherein the dielectric film comprises a plurality of pores.

* * * * *